United States Patent
Wei et al.

(10) Patent No.: US 6,864,516 B2
(45) Date of Patent: Mar. 8, 2005

(54) SOI MOSFET JUNCTION DEGRADATION USING MULTIPLE BURIED AMORPHOUS LAYERS

(75) Inventors: Andy Wei, Austin, TX (US); Akif Sultan, Austin, TX (US); David Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 10/085,903

(22) Filed: Feb. 28, 2002

(65) Prior Publication Data

US 2003/0162336 A1 Aug. 28, 2003

(51) Int. Cl.$^7$ ............................................. H01L 29/74
(52) U.S. Cl. ....................... 257/156; 257/446; 257/461; 438/48; 438/162; 438/164; 438/166; 438/174; 438/186
(58) Field of Search .................. 438/48, 155, 162, 438/164, 166, 174, 186; 257/156, 291, 292, 443, 446, 461

(56) References Cited

U.S. PATENT DOCUMENTS

| | | | |
|---|---|---|---|
| 5,698,869 A | * 12/1997 | Yoshimi et al. | ............. 257/192 |
| 5,825,066 A | 10/1998 | Buynoski | ..................... 257/345 |
| 6,225,176 B1 | 5/2001 | Yu | ............................... 438/305 |
| 6,380,037 B1 | * 4/2002 | Osanai | ........................ 438/294 |
| 6,423,993 B1 | * 7/2002 | Suzuki et al. | ................ 257/292 |

FOREIGN PATENT DOCUMENTS

| | | | |
|---|---|---|---|
| EP | 0 935 389 A | 8/1999 | ............ H04N/5/74 |
| JP | 2001244477 A | 9/2001 | ......... H01L/29/786 |
| WO | WO 03 012844 A | 2/2003 | ......... H01L/21/265 |

OTHER PUBLICATIONS

Stanley Wolf and Richard N. Tauber; *Silicon Processing for the VLSI Era*, vol. 2—*Process Integration*; 1990; pp. 298–299.

* cited by examiner

Primary Examiner—Hsien-Ming Lee
(74) Attorney, Agent, or Firm—Timothy M. Honeycut

(57) ABSTRACT

Various circuit devices incorporating junction-traversing dislocation regions and methods of making the same are provided. In one aspect, a method of processing is provided that includes forming an impurity region in a device region of a semiconductor-on-insulator substrate. The impurity region defines a junction. A dislocation region is formed in the device region that traverses the junction. The dislocation region provides a pathway to neutralize charge lingering in a floating body of a device.

29 Claims, 6 Drawing Sheets

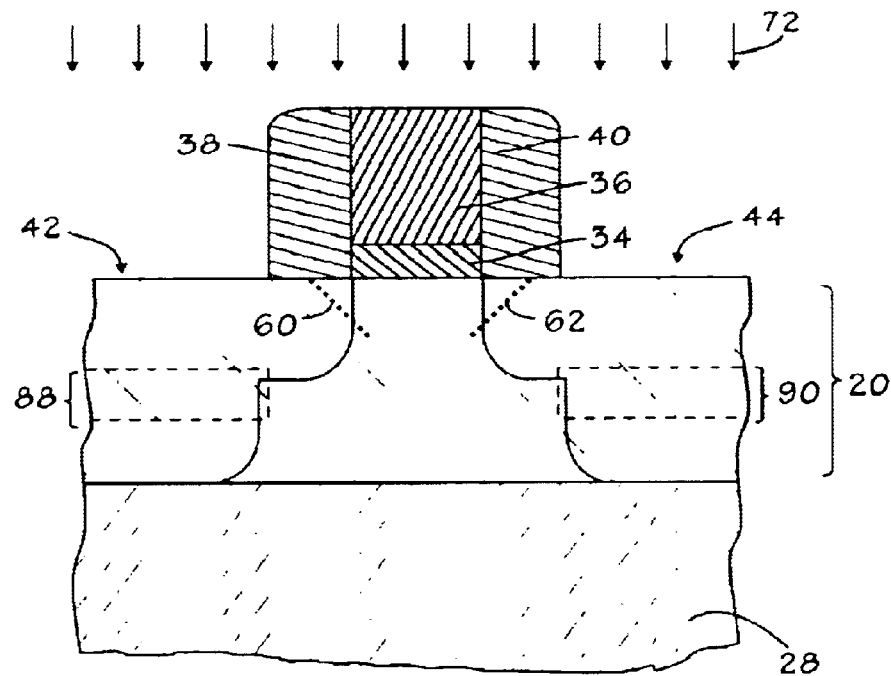
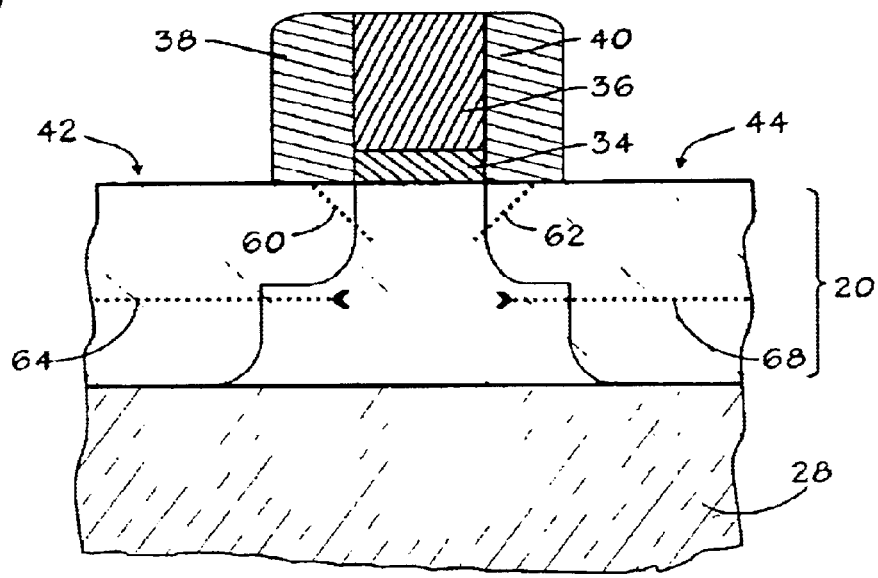

SOI MOSFET JUNCTION DEGRADATION USING MULTIPLE BURIED AMORPHOUS LAYERS

BACKGROUND OF THE INVENTION

1. Field of the Invention

This invention relates generally to semiconductor processing, and more particularly to circuit devices incorporating dislocation regions for charge neutralization and to methods of making the same.

2. Description of the Related Art

Integrated circuit fabrication on semiconductor-on-insulator ("SOI") substrates holds the promise of significant device scaling through increased packing density. In complimentary metal oxide semiconductor ("CMOS") circuit designs, SOI eliminates some latch-up issues normally present in CMOS design rules. In SOI substrates, junction isolation is provided by surrounding active device regions with an insulator. A typical SOI substrate includes a plurality of silicon islands formed on an insulating layer, usually of oxide. The silicon islands are also isolated laterally by an insulator, again usually an oxide.

Device fabrication on SOI substrates is similar in many respects to conventional device fabrication on conventional semiconductor substrates in which device isolation is provided by trench isolation or field oxide regions and impurity wells. For example, one conventional technique for field effect transistor fabrication on a SOI substrate entails gate dielectric layer and gate electrode fabrication followed by a self-aligned lightly doped drain ("LDD") implant and a source/drain implant. Spacers may be applied to provide lateral set-off of the impurity regions.

In some conventional processes tailored for device isolation via impurity wells and isolation trenches, an amorphization implant is performed following gate electrode formation but prior to source/drain region implants. The goal of the amorphization implant is to establish surface amorphous regions that are self-aligned to the gate electrode. The surface level amorphous regions make the upper reaches of the device region resistant to ionic channeling during ion implantation. The subsequently-performed LDD implant will exhibit little ionic channeling and produce a relatively shallow p-n junction. The amorphous regions are later recrystallized during an anneal step.

One technical hurdle associated with SOI device fabrication is associated with floating body effects. In a conventional substrate wherein device isolation is provided by isolation trenches and impurity wells, the body of a transistor is coupled electrically to the remainder of the substrate. However, in a SOI substrate, the body of the device is floating. As a consequence, charge can accumulate in the body. The amount and rate of charge accumulation are dependent upon a number of factors, such as the number of times of the transistor is switched on and off and the geometry of the transistor and the device region, to name a few. Accumulated charge in the body can lead to undesirable variances in the switching speed of the transistor. The problem of floating body effects is generally more acute for partially depleted devices, such as partially depleted field effect transistors, than for fully depleted devices.

The present invention is directed to overcoming or reducing the effects of one or more of the foregoing disadvantages.

SUMMARY OF THE INVENTION

In accordance with one aspect of the present invention, a method of processing is provided that includes forming an impurity region in a device region of a semiconductor-on-insulator substrate. The impurity region defines a junction. A dislocation region is formed in the device region that traverses the junction.

In accordance with another aspect of the present invention, a method of processing is provided that includes forming an impurity region in a device region of a substrate. The impurity region defines a junction. At least two dislocation regions are formed in the device region that traverse the junction.

In accordance with another aspect of the present invention, a method of processing is provided that includes forming a first impurity region and a second impurity region in a device region of a semiconductor-on-insulator substrate. The first impurity region defines a first junction and the second impurity region defines a second junction. A first dislocation region is formed in the device region that traverses the first junction, and a second dislocation region is formed in the device region that traverses the second junction.

In accordance with another aspect of the present invention, a circuit device is provided that includes a semiconductor-on-insulator substrate that has a device region. An impurity region is in the device region. The impurity region defines a junction. A dislocation region is in the device region that traverses the junction.

In accordance with another aspect of the present invention, a circuit device is provided that includes a semiconductor-on-insulator substrate that has a device region. A first impurity region is in the device region and has a first extension region that defines a first junction. A second impurity region is in the device region and has a second extension region that defines a second junction. The second junction is separated from the first junction to define a channel. A first dislocation region is in the device region and traverses the first junction. A second dislocation region is in the device region and traverses the second junction.

BRIEF DESCRIPTION OF THE DRAWINGS

The foregoing and other advantages of the invention will become apparent upon reading the following detailed description and upon reference to the drawings in which:

FIG. 9 is a cross-sectional view depicting formation of amorphous regions in an alternate method in accordance with the present invention;

FIG. 10 is a cross-sectional view like FIG. 9 depicting formation of dislocation regions from the amorphous regions in accordance with the present invention.

DETAILED DESCRIPTION OF SPECIFIC EMBODIMENTS

Figure 1:
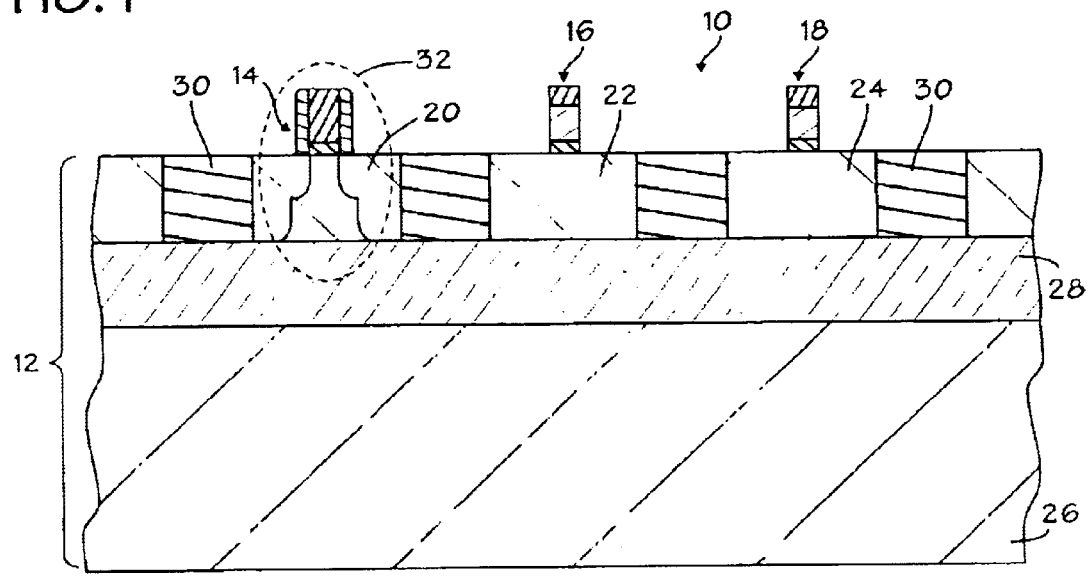
FIG. 1 is a cross-sectional view of an exemplary embodiment of an integrated circuit implemented on a semiconductor-on-insulator substrate in accordance with the present invention.

In the drawings described below, reference numerals are generally repeated where identical elements appear in more than one figure. Turning now to the drawings, and in particular to FIG. 1, therein is shown a cross-sectional view of an exemplary embodiment of an integrated circuit 10 implemented on a semiconductor-on-insulator substrate 12. One or more circuit devices 14, 16 and 18 are provided on the semiconductor-on-insulator substrate 12 for the purpose of providing desired electronic functions. The circuit devices 14, 16 and 18 are implemented on respective device regions 20, 22 and 24 that are composed of a suitable semiconductor substrate material, such as, for example, silicon, germanium, or the like. In an exemplary embodiment, the device regions 20, 22 and 24 are composed of silicon. The circuit elements 14, 16 and 18 are depicted as a field effect transistor, and capacitors respectively. However, it should be understood that these particular circuit elements are merely illustrative of the myriad of different types of circuit elements that may be fashioned on the integrated circuit 10.

The insulator portion of the semiconductor-on-insulator substrate 12 consists of a base substrate 26, an insulator film or substrate 28 positioned on the base substrate 26, and an insulating film 30 positioned on the insulator substrate 28. The base substrate 26 may be an insulator or a semiconductor as desired. Exemplary materials include, for example, oxide, silicon, germanium, polymeric materials, laminates of these or the like.

The insulator substrate 28 may be composed of well-known insulator materials, such as, for example, oxide, silicon nitride, sapphire, laminates of these or the like. Optionally, the insulator substrate 28 may be formed as a buried insulating layer. The insulating film 30 may be composed of the same types of materials.

The insulator substrate 28 and the insulating film 30 subdivide the device regions 20, 22 and 24 into semiconductor islands. That is, the device regions 20, 22 and 24 are laterally and vertically electrically isolated by insulating material.

Figure 2:
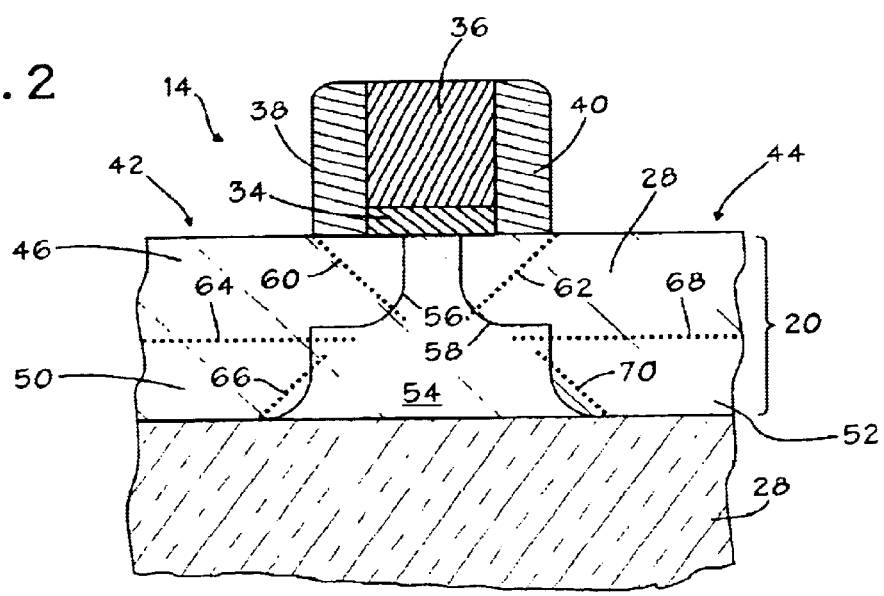
FIG. 2 is a magnified cross-sectional view of a portion of FIG. 1 in accordance with the present invention.

The dashed oval 32 in FIG. 1 represents an area that is illustrated in a magnified cross-sectional view in FIG. 2 to present a more detailed depiction of the circuit device or transistor 14. Referring now to FIG. 2, the transistor 14 consists of a gate insulating layer 34 positioned on the semiconductor island or device region 20 and a gate electrode 36 positioned on the gate insulating layer 34. A pair of insulating spacers 38 and 40 are positioned adjacent to the gate electrode 36 and gate insulating layer 34 in order to facilitate the formation of impurity regions 42 and 44.

The gate dielectric layer 34, the gate electrode 36, and the spacers 38 and 40 may be fabricated in any of a myriad of well-known ways using well-known materials and techniques. The impurity regions 42 and 44 consist of respective extension regions 46 and 48 and overlapping impurity regions 50 and 52. Optionally, the impurity regions 42 and 44 may be implemented as single-graded regions. The lateral separation between the impurity regions 42 and 44 defines a channel or body 54 of the device 14. The lateral boundaries of the impurity regions 42 and 44 adjacent to the channel or body 54 are defined by junctions 56 and 58 that may be p-n or n-p as desired.

As noted above, the potential for charge build-up within a floating body of a semiconductor-on-insulator circuit device, such as a transistor, can lead to unpredictable permutations in the performance of the device. In order to reduce the impact of charge build-up within the body 54 of the device 14, one or more dislocation regions are provided in the device region 20 that traverse the junctions 56 and 58. In the embodiment illustrated, dislocation regions 60 and 62 are positioned across the respective portions of the junctions 56 and 58 proximate the extension regions 46 and 48, and dislocation regions 64 and 66 are positioned proximate the overlapping impurity region 50 and cross the junction 56 into the body 54. A similar pair of dislocation regions 68 and 70 are positioned proximate the overlapping impurity region 52 and cross therefrom into the body 54. The purpose of the dislocation regions 60, 62, 64, 66, 68 and 70 is to provide regions where charge accumulating in the body 54 can flow into the impurity regions 42 and 44 and become neutralized through the process of charge recombination.

As described more fully below, the dislocations 60, 62, 64, 66, 68 and 70 are deliberately created in the device region 20 by implantation of neutral species to form amorphous regions within the device region 20 followed by an anneal process or processes to initiate recrystallization of the amorphous regions. During the recrystallization process, the dislocations 60, 62, 64, 66, 68 and 70 form. The dislocations 60, 62, 64, 66, 68 and 70 each consist of a plurality of localized crystal structure dislocations that line up along a plane as indicated by the dashed lines in FIG. 2. The planes are shown edge-on in FIG. 2 and thus proceed into and out of the drawing page.

Figure 3:
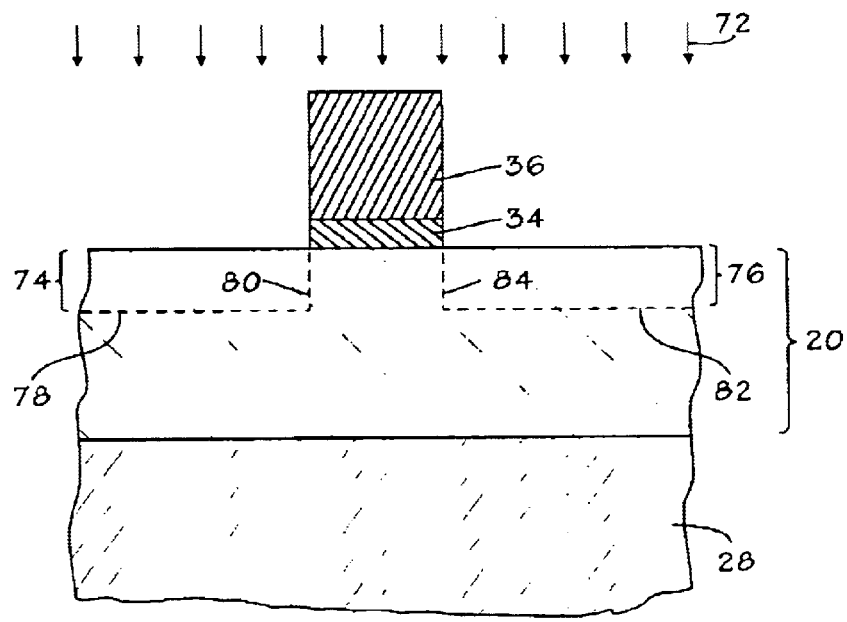
FIG. 3 is a cross-sectional view of an exemplary method of forming amorphous regions in a semiconductor-on-insulator substrate in accordance with the present invention.

An exemplary method in accordance with the present invention for fabricating the circuit device 14 may be understood by referring now to FIGS. 3, 4, 5, 6, 7 and 8. Referring initially to FIG. 3, the gate insulating layer 34 and the gate electrode 36 may be formed using well-known materials and techniques. For example, the gate insulating layer 34 may be composed of oxide, silicon nitride, well-known high permittivity materials, laminates of these or the like, and applied using oxidation, chemical vapor deposition or the like. The gate electrode 36 may be composed of polysilicon, aluminum, tantalum, tungsten, titanium, metal silicides, copper or the like and applied using chemical vapor deposition, physical vapor deposition or the like. In an exemplary embodiment, the gate electrode 36 and the gate insulating layer 34 are patterned by suitable masking and directional etching.

An implant of a neutral species 72 is performed with the gate electrode 36 serving as an implant hard mask in order to establish amorphous regions 74 and 76 in the device region 20. The boundaries of the amorphous region 74 are illustrated by the intersecting horizontal dashed line 78 and vertical dashed line 80. The borders of the amorphous region 76 are represented by the intersecting horizontal line 82 and vertical line 84. The neutral species 72 may be any of a variety of substances that may be implanted as neutral species, such as, for example, xenon, silicon, germanium, argon or the like. In an exemplary embodiment, xenon is implanted at an energy of about 30 to 130 keV, a dosage of about 6.0E13 to 3.0E14 ions-cm$^{-2}$ and an implant angle of about 0°. An off-axis implantation angle may be used for this or any of the other implants disclosed elsewhere herein.

Figure 4:
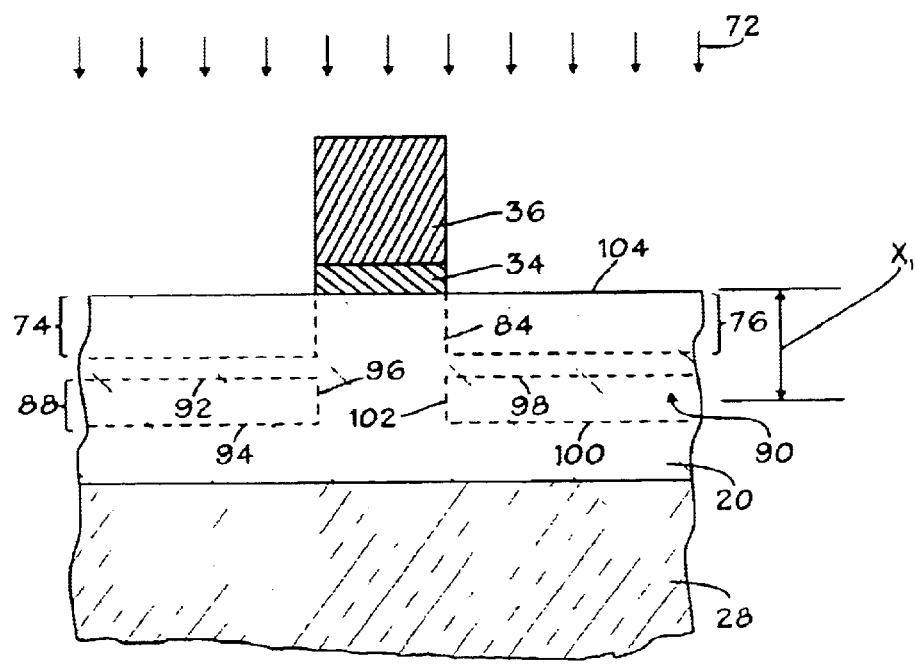
FIG. 4 is a cross-sectional view of an exemplary method of forming additional amorphous regions in a semiconductor-on-insulator substrate in accordance with the present invention.

As shown in FIG. 4, an implant of a neutral species 72 is again performed, this time with an energy selected to position the peak concentration of the neutral species 72 at a depth $X_1$ into the device region 20. The purpose of the implant is to establish buried amorphous regions 88 and 90 that are generally self-aligned with the gate electrode 36 as shown. The vertical borders of the buried amorphous region 88 are delineated by horizontal dashed lines 92 and 94, and the lateral border by the vertical dashed line 96. The vertical borders of the buried amorphous region 90 are delineated by the dashed lines 98 and 100 and the channel-facing vertical border thereof is designated by the dashed line 102. The energy for the implant of the neutral specie 72 is selected to position the peak concentration of the specie 72 within the device region 20 at a depth $X_1$ from the upper surface 104 of the device region 20. The neutral species may be of the type described above in conjunction with the formation of the amorphous region 74 and 76 in FIG. 3. In an exemplary embodiment, xenon is implanted at an energy of about 90 to 120 keV, a dosage of about 8E13 to 1.2E14 ions-cm$^{-2}$, and an implant angle of about 0°. The dosage and energy of the implant should be selected so that the buried amorphous regions 88 and 90 are established in the device region 20 with crystalline material positioned above and below each of the regions 88 and 90.

Figure 5:
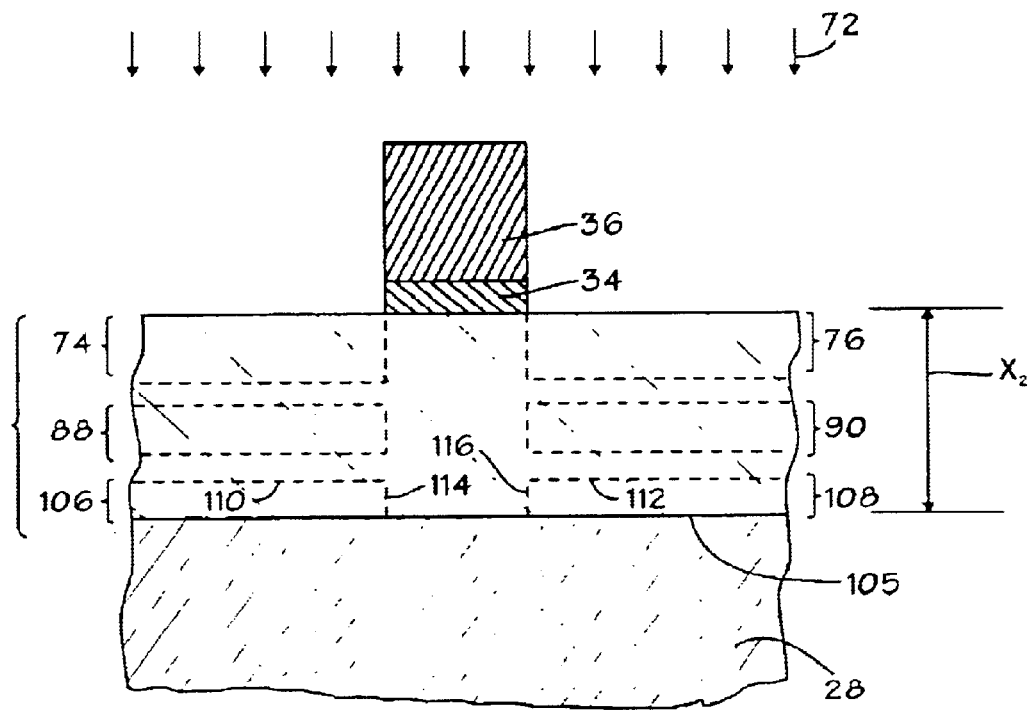
FIG. 5 is a cross-sectional view of an exemplary method of forming additional amorphous regions in a semiconductor-on-insulator substrate in accordance with the present invention.

As shown in FIG. 5, another implant of the neutral specie 72 is performed to establish buried amorphous regions 106 and 108 proximate the interface between the device region 20 and the underlying insulator substrate 28. The upper boundaries of the buried amorphous regions 106 and 108 are respectively delineated by the horizontal dashed lines 110 and 112, and the channel-facing boundaries are delineated by the horizontal dashed lines 114 and 116 respectively. As with the previous amorphization implants, the gate electrode 36 and the gate dielectric layer 34 serve as a hard mask against the implant. Note, however, that care should be exercised in tailoring the energy of the implant of the neutral specie 72 so that the projected range does not penetrate the gate electrode 36 and the gate dielectric layer 34 and result in a crystalline disruption of the channel 54 beneath the gate dielectric layer 34. The neutral specie 72 may be as generally described elsewhere herein. The energy of the implant is selected to position the peak concentration of the implanted neutral species approximately at the interface 105 between the device region 20 and the insulator substrate 28. In an exemplary embodiment, xenon may be implanted at an energy of about 150 to 250 keV, a dosage of about 8E13 to 1.2E14 ions-cm$^{-2}$, and an implant angle of about 0°. With the amorphous regions 74, 76, 88, 90, 106 and 108 in place, the process may proceed to fabrication of the impurity regions 42 and 44.

The skilled artisan will appreciate that the implants of the a neutral species may be implemented using the same substance, e.g., xenon. Optionally, different substances may be used for the implants, e.g., xenon, silicon, germanium, argon, etc.

Figure 6:
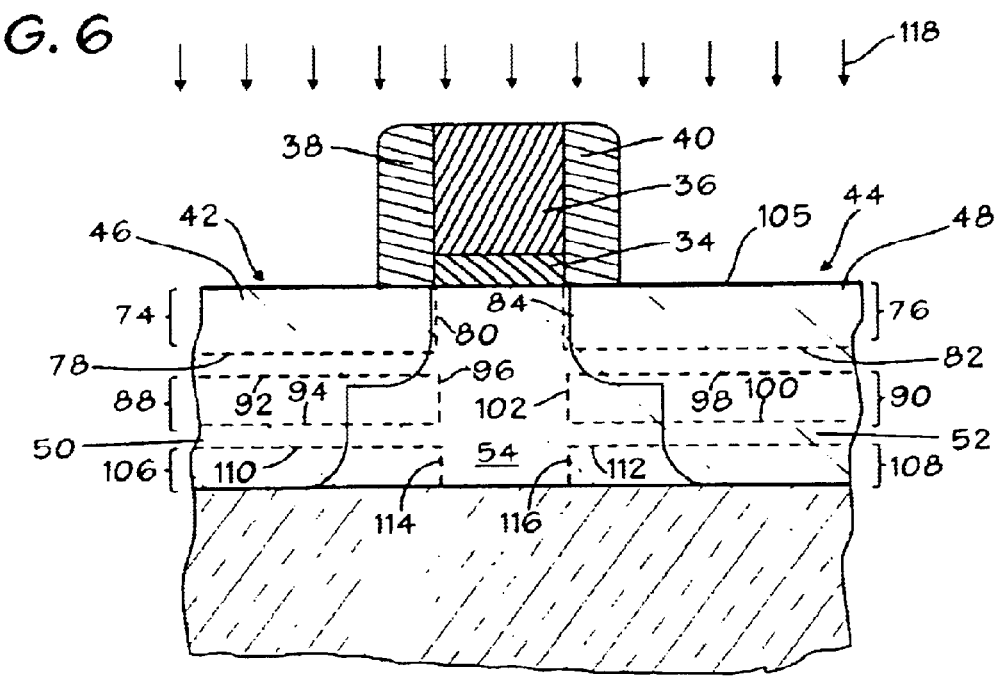
FIG. 6 is a cross-sectional view like FIG. 5 depicting formation of impurity regions in the semiconductor-on-insulator substrate in accordance with the present invention.

Referring now to FIG. 6, the impurity regions 42 and 44 may be established in the device region 20 using well-known ion implantation techniques. The extension regions 46 and 48 may be established self-aligned to the gate electrode 36 and thereafter, the insulating spacers 38 and 40 may be added to provide an offset for the implantation of ions 118 to establish the overlapping regions 50 and 52. The parameters for the impurity species implants are largely matters of design discretion.

Figure 7:
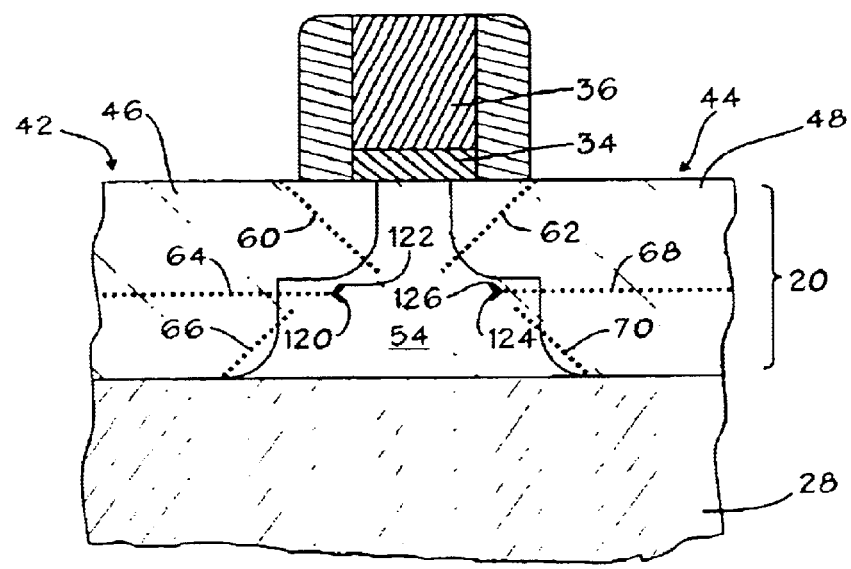
FIG. 7 is a cross-sectional view like FIG. 6 depicting formation of dislocation regions from the amorphous regions in accordance with the present invention.

At this point, an activation anneal is performed to activate the impurity regions 42 and 44. In an exemplary embodiment, the anneal may be performed at about 900 to 1060° C. for about 5 to 120 seconds in a rapid thermal anneal process. The anneal serves the dual purpose of activating the impurity regions 42 and 44 and recrystallizing the amorphous regions 74, 76 and the buried amorphous regions 88, 90, 106 and 108 to produce the dislocation regions 60, 62, 64, 66, 68 and 70 as shown in FIG. 7. As the amorphous region 74 begins to recrystallize, the lateral boundary 80 proceeds laterally away from the channel 54 and the horizontal boundary 78 proceeds upward toward the upper surface 105 of the device region 20. As these boundaries migrate laterally and vertically, the dislocation region 60 is formed. A similar phenomenon occurs with regard to the buried amorphous region 88, that is, the boundaries 92 and 94 of the buried amorphous region 88 move downward and upward, respectively, and the lateral boundary 96 moves away from the channel 54 during recrystallization. The dislocation region 64 is established with small obliquely projecting portions 120 and 122 as shown in FIG. 7. The portions 120 and 122 are due to the interactions of the upper and lower corner intersections between the boundary 96 and the boundaries 92 and 94. As the buried amorphous region 106 recrystallizes, the horizontal boundary 110 moves downward and the lateral boundary 114 moves away from the channel 54, producing the dislocation region 66.

The same mechanisms apply to the amorphous region 76 and the buried amorphous regions 90 and 108, albeit in a flip-flopped spatial orientation relative to the amorphous region 74 and the buried amorphous regions 88 and 106. Indeed, due to the movements of the boundaries 82, 84, 98, 100, 102, 112 and 116, the dislocation regions 62, 68 and 70 are established during recrystallization. Like the dislocation region 64, the dislocation region 68 forms with obliquely oriented projections 124 and 126. Note also that the anneal produces a lateral migration of the impurities of the impurity regions 42 and 44, which produces a slight underlap between the extension regions 46 and 48 and the gate electrode 36 and gate dielectric layer 34.

Figure 8:
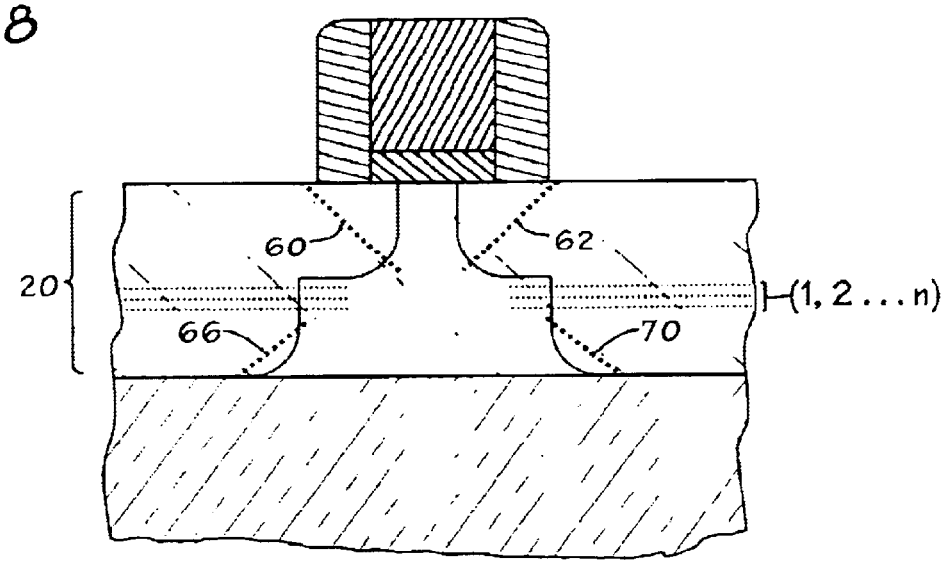
FIG. 8 is a cross-sectional view like FIG. 7 depicting an alternate exemplary embodiment in which multiple dislocation regions are formed in accordance with the present invention.

The number of dislocation regions produced is largely a matter of design discretion. For example, and as illustrated in FIG. 8, the device region 20 may be provided with the dislocation regions 60, 62, 66 and 70 as described generally elsewhere herein. In addition, multiple dislocation regions {1, 2 . . . n} may be provided simply by performing multiple neutral species implants with varying dosages and energies to produce multiple amorphous regions and one or more anneals to provide recrystallization, also as described generally elsewhere herein.

Figure 11:
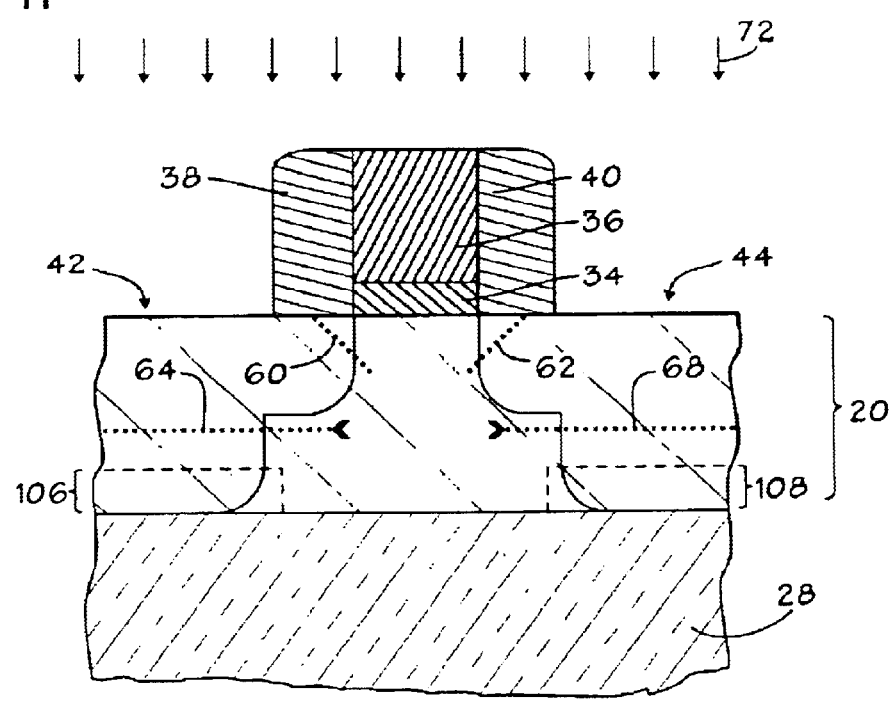
FIG. 11 is a cross-sectional view like FIG. 10 depicting formation of additional amorphous regions in accordance with the present invention.

In the foregoing illustrative embodiments, the fabrication of the buried amorphous regions 88, 90, 106 and 108 precedes fabrication of the impurity regions 42 and 44. However, considerable flexibility in the order of processing steps is envisioned in accordance with the present invention. FIGS. 9, 10 and 11 illustrate an alternate exemplary process flow in accordance with the present invention. In this embodiment, the dislocation regions 60 and 62 and the impurity regions 42 and 44 may be established as generally described elsewhere herein. Following fabrication of the impurity regions 42 and 44, the buried amorphous regions 88 and 90 may be formed in the device region 20 using the techniques described elsewhere herein and with the gate dielectric layer 34, the gate electrode 36 and the spacers 38 and 40 serving as a hard mask against the implant.

Next, and as shown in FIG. 10, a recrystallization anneal may be performed to recrystallize the buried amorphous regions 88 and 90 and establish the dislocation regions 64 and 68. The recrystallization anneal can be advantageously performed at a relatively low temperature that does not consume thermal budget. For example, the anneal may be performed at about 600 to 650° C. for a time greater than about a minute.

Next, and as shown in FIG. 11, the buried amorphous regions 106 and 108 may be established in the device region 20 by implantation of the neutral specie 72 using the techniques described elsewhere herein. A recrystallization anneal may be performed next as described elsewhere herein to recrystallize the buried amorphous regions 106 and 108 and establish the dislocation regions 66 and 70 as depicted in FIG. 7. Optionally, both the buried amorphous regions 88 and 90 and the buried amorphous regions 106 and 108 may be established prior to a single low temperature recrystallization anneal.

The skilled artisan will appreciate that the devices fabricated in accordance with the present invention alleviate some of the difficulties associated with floating body effects in SOI processing. One or more junction-traversing dislocation regions may be formed in a device region to provide a gateway for accumulated charge to dissipate. Several dislocation regions may be formed at various depths in the device region to provide comprehensive charge dissipation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of processing, comprising:
   forming an impurity region in a device region of a semiconductor-on-insulator substrate, the impurity region defining a junction;
   forming a buried amorphous region in the device region; and
   forming a dislocation region in the device region by annealing the semiconductor-on-insulator substrate to recrystallize the buried amorphous region, the dislocation region traversing the junction.

2. The method of claim 1, wherein the forming of the impurity region comprises forming a source/drain extension region and another impurity region overlapping the source/drain extension region.

3. The method of claim 2, wherein the source/drain extension region and the another impurity region are formed by ion implantation.

4. The method of claim 1, comprising forming a gate electrode on the device region.

5. The method of claim 1, wherein the forming of the buried amorphous region comprises implanting a neutral species ions into the device region.

6. A method of processing, comprising:
   forming an impurity region in a device region of a semiconductor-on-insulator substrate, the impurity region defining a junction;
   forming a buried amorphous region in the device region; and
   forming at least two dislocation regions in the device region, one of the at least two dislocation regions being formed by annealing the semiconductor-on-insulator substrate to recrystallize the buried amorphous regions the at least two dislocation regions traversing the junction.

7. The method of claim 6, wherein the forming of the impurity region comprises forming a source/drain extension region and another impurity region overlapping the source/drain extension region.

8. The method of claim 7, wherein the source/drain extension region and the another impurity region are formed by ion implantation.

9. The method of claim 7, wherein a first of the at least two dislocation regions traverses a portion of the junction proximate the source/drain extension region and a second of the at least two dislocation regions traverses a portion of the junction proximate the another impurity region.

10. The method of claim 6, comprising forming a gate electrode on the device region.

11. The method of claim 6, wherein the forming of the at least two dislocation regions comprises forming at least two buried amorphous regions in the device region and heating the semiconductor-on-insulator substrate to recrystallize the at least two buried amorphous regions.

12. The method of claim 11, wherein the forming of the at least two buried amorphous regions comprises implanting neutral species ions into the device region.

13. A method of processing, comprising:
   forming a first impurity region and a second impurity region in a device region of a semiconductor-on-insulator substrate, the first impurity region defining a first junction and the second impurity region defining a second junction;
   forming a first buried amorphous region and a second buried amorphous region in the device region; and
   forming a first dislocation region and a second dislocation region in the device region by annealing the semiconductor-on-insulator substrate to recrystallize the first and second buried amorphous regions, the first dislocation region traversing the first junction, and the second dislocation region traversing the second junction.

14. The method of claim 13 wherein the forming of the first impurity region comprises forming a first source/drain extension region and a first overlapping impurity region overlapping the source/drain extension region, and the forming of the second impurity region comprises forming a second source/drain extension region and second overlapping impurity region overlapping the second source/drain extension region.

15. The method of claim 14, wherein the first and second source/drain extension regions and the first and second overlapping impurity regions are formed by ion implantation.

16. The method of claim 13, comprising forming a gate electrode on the device region.

17. The method of claim 13, wherein the forming of the first and second buried amorphous regions comprises implanting neutral species ions into the device region.

18. A circuit device, comprising:
   a semiconductor-on-insulator substrate having a device region;
   an impurity region in the device region, the impurity region defining a junction and including an extension region and an overlapping region; and
   a first dislocation region and a second dislocation region in the device region, the first and second dislocation region being in non-parallel spatial relationship and traversing the junction.

19. The circuit device of claim 18, wherein the first dislocation region traverses the junction proximate the extension region.

20. The circuit device of claim 18, wherein the first dislocation region traverses the junction proximate the overlapping region.

21. The circuit device of claim 18, comprising a gate electrode.

22. The circuit device of claim 18, comprising a plurality of dislocation regions traversing the junction.

23. The circuit device of claim 18, wherein the device region comprises silicon.

24. A circuit device, comprising:
  a semiconductor-on-insulator substrate having a device region;
  a first impurity region in the device region, the first impurity region having a first extension region and defining a first junction;
  a second impurity region in the device region, the second impurity region having a second extension region and defining a second junction, the second junction being separated from the first junction to define a channel;
  a first dislocation region in the device region, the first dislocation region traversing the first junction; and
  a second dislocation region in the device region, the second dislocation region traversing the second junction.

25. The circuit device of claim 24, wherein the first dislocation region traverses the first junction proximate the first extension region.

26. The circuit device of claim 25, wherein the second dislocation region traverses the second junction proximate the second extension region.

27. The circuit device of claim 24, comprising a first plurality of dislocation regions traversing the first junction and a second plurality of dislocation regions traversing the second junction.

28. The circuit device of claim 24, comprising a gate electrode.

29. The circuit device of claim 24, wherein the device region comprises silicon.

* * * * *